(12) United States Patent
Joo et al.

(10) Patent No.: US 8,610,140 B2
(45) Date of Patent: Dec. 17, 2013

(54) LIGHT EMITTING DIODE (LED) PACKAGES, SYSTEMS, DEVICES AND RELATED METHODS

(75) Inventors: Sung Chul Joo, Cary, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/462,450

(22) Filed: May 2, 2012

(65) Prior Publication Data
US 2012/0307481 A1 Dec. 6, 2012

Related U.S. Application Data

(63) Continuation-in-part of application No. 13/367,929, filed on Feb. 7, 2012, and a continuation-in-part of application No. 13/362,683, filed on Jan. 31, 2012, and a continuation-in-part of application No. 29/382,394, filed on Jan. 3, 2011, now Pat. No. Des. 679,842, and a continuation-in-part of application No. 12/969,267, filed on Dec. 15, 2010.

(60) Provisional application No. 61/482,088, filed on May 3, 2011.

(51) Int. Cl.
*H01L 33/60* (2010.01)

(52) U.S. Cl.
USPC .................. 257/88; 257/E33.066; 438/27

(58) Field of Classification Search
USPC .............. 257/88, E33.066; 362/97.1, 241; 438/27
See application file for complete search history.

(56) References Cited

U.S. PATENT DOCUMENTS

| 4,679,118 A | 7/1987 | Johnson et al. |
| 4,946,547 A | 8/1990 | Palmour |
| 5,200,022 A | 4/1993 | Kong |
| 5,210,051 A | 5/1993 | Carter, Jr. |
| RE34,861 E | 2/1995 | Davis et al. |
| 5,393,993 A | 2/1995 | Edmond |
| 5,506,446 A | 4/1996 | Hoffman et al. |

(Continued)

FOREIGN PATENT DOCUMENTS

| CN | 200930286397.5 | 10/2010 |
| CN | ZL 2011-30010728 | 1/2012 |

(Continued)

OTHER PUBLICATIONS

Non-Final Office Action for U.S. Appl. No. 13/227,961 dated Mar. 26, 2013.

(Continued)

*Primary Examiner* — Roy Potter
(74) *Attorney, Agent, or Firm* — Jenkins, Wilson, Taylor & Hunt, P.A.

(57) ABSTRACT

Packages, systems, and devices for light emitting diodes (LEDs) and related methods are provided. The packages can include a lead frame with an electrically conductive chip carrier comprising an upper surface. An LED can be placed on the upper surface of the electrically conductive chip carrier. A casing can be disposed on the lead frame covering at least a portion of the lead frame. A reflector cavity can be in the casing surrounding the LED. The reflector cavity can have angled side wall portions and angled end wall portions with an angle at which the side wall portions are angled that is different from an angle at which the end wall portions are angled.

37 Claims, 10 Drawing Sheets

(56) References Cited

U.S. PATENT DOCUMENTS

| | | | |
|---|---|---|---|
| 5,523,589 A | 6/1996 | Edmond | |
| 6,274,924 B1 | 8/2001 | Carey et al. | |
| 6,610,563 B1 | 8/2003 | Waitl | |
| 6,828,170 B2 | 12/2004 | Roberts et al. | |
| 6,936,855 B1 | 8/2005 | Harrah | |
| 6,943,433 B2 | 9/2005 | Kamada | |
| D514,073 S | 1/2006 | Suenaga | |
| 7,081,661 B2 | 7/2006 | Takehara et al. | |
| 7,224,047 B2 | 5/2007 | Carberry et al. | |
| 7,244,965 B2 | 7/2007 | Andrews et al. | |
| D566,055 S | 4/2008 | Kim | |
| 7,361,940 B2 | 4/2008 | Kim et al. | |
| D573,113 S | 7/2008 | Bando | |
| D573,114 S | 7/2008 | Min et al. | |
| 7,400,049 B2 | 7/2008 | Shim | |
| 7,429,790 B2 | 9/2008 | Condie et al. | |
| 7,432,589 B2 | 10/2008 | Yamamoto et al. | |
| D580,375 S | 11/2008 | Yen | |
| D580,381 S | 11/2008 | Bando | |
| D580,891 S | 11/2008 | Sung et al. | |
| 7,456,499 B2 | 11/2008 | Loh | |
| 7,462,870 B2 | 12/2008 | Nakashima | |
| D584,699 S | 1/2009 | Bando | |
| D594,827 S | 6/2009 | Loh et al. | |
| D595,675 S | 7/2009 | Wang et al. | |
| 7,564,180 B2 | 7/2009 | Brandes | |
| 7,566,159 B2 | 7/2009 | Oon et al. | |
| D597,968 S | 8/2009 | Kobayakawa et al. | |
| D597,971 S | 8/2009 | Kobayakawa et al. | |
| D598,400 S | 8/2009 | Bando | |
| 7,592,638 B2 | 9/2009 | Kim | |
| 7,659,551 B2 * | 2/2010 | Loh | 257/98 |
| D614,592 S | 4/2010 | Hussell et al. | |
| 7,692,206 B2 | 4/2010 | Loh | |
| D615,504 S | 5/2010 | Keller et al. | |
| 7,719,024 B2 | 5/2010 | Bando | |
| D621,798 S | 8/2010 | Lu et al. | |
| D621,799 S | 8/2010 | Hussell et al. | |
| D622,680 S | 8/2010 | Lin et al. | |
| 7,791,061 B2 | 9/2010 | Edmond et al. | |
| D626,095 S | 10/2010 | Hseih | |
| D627,310 S | 11/2010 | Lin et al. | |
| D628,541 S | 12/2010 | Lin | |
| 7,852,015 B1 | 12/2010 | Yen et al. | |
| D632,267 S | 2/2011 | Chen et al. | |
| D632,659 S | 2/2011 | Hseih | |
| D634,284 S | 3/2011 | Ko et al. | |
| D634,285 S | 3/2011 | Ko et al. | |
| D634,286 S | 3/2011 | Ko et al. | |
| D634,716 S | 3/2011 | Suzuki | |
| D635,527 S | 4/2011 | Hussell et al. | |
| 7,923,739 B2 | 4/2011 | Hussell | |
| D641,719 S | 7/2011 | Hussell et al. | |
| D643,819 S | 8/2011 | Joo | |
| D648,686 S | 11/2011 | Hussell et al. | |
| D648,687 S | 11/2011 | Joo et al. | |
| D658,599 S | 5/2012 | Takahashi et al. | |
| D659,657 S | 5/2012 | Hussell et al. | |
| D661,264 S | 6/2012 | Joo et al. | |
| D667,801 S | 9/2012 | Joo et al. | |
| 8,269,244 B2 | 9/2012 | Hussell | |
| 8,354,992 B2 | 1/2013 | Rumreich et al. | |
| D679,842 S | 4/2013 | Joo et al. | |
| 2001/0045640 A1 | 11/2001 | Oida et al. | |
| 2004/0075100 A1 | 4/2004 | Bogner et al. | |
| 2004/0079957 A1 | 4/2004 | Andrews et al. | |
| 2006/0118808 A1 | 6/2006 | Ishidu et al. | |
| 2006/0157726 A1 | 7/2006 | Loh et al. | |
| 2006/0186418 A1 | 8/2006 | Edmond et al. | |
| 2006/0220050 A1 | 10/2006 | Higaki et al. | |
| 2007/0052074 A1 | 3/2007 | Hasegawa | |
| 2007/0057364 A1 | 3/2007 | Wang et al. | |
| 2007/0075325 A1 | 4/2007 | Baek et al. | |
| 2007/0114514 A1 | 5/2007 | Ito | |
| 2008/0006837 A1 | 1/2008 | Park et al. | |
| 2008/0023722 A1 | 1/2008 | Lee et al. | |
| 2008/0185605 A1 | 8/2008 | Wada et al. | |
| 2008/0258130 A1 | 10/2008 | Bergmann et al. | |
| 2008/0258162 A1 | 10/2008 | Koung et al. | |
| 2008/0278941 A1 | 11/2008 | Logan et al. | |
| 2008/0283849 A1 | 11/2008 | Imai | |
| 2008/0290353 A1 | 11/2008 | Medendorp | |
| 2009/0008662 A1 | 1/2009 | Ashdown et al. | |
| 2009/0101921 A1 | 4/2009 | Lai | |
| 2009/0122533 A1 | 5/2009 | Brukilacchio | |
| 2009/0159905 A1 | 6/2009 | Chen | |
| 2009/0189178 A1 | 7/2009 | Kim et al. | |
| 2009/0267085 A1 | 10/2009 | Lee et al. | |
| 2009/0321779 A1 | 12/2009 | Kim et al. | |
| 2010/0059783 A1 | 3/2010 | Chandra | |
| 2010/0102345 A1 | 4/2010 | Kong et al. | |
| 2010/0133554 A1 | 6/2010 | Hussell | |
| 2010/0133578 A1 | 6/2010 | Pickard et al. | |
| 2010/0155748 A1 | 6/2010 | Chan et al. | |
| 2010/0163887 A1 | 7/2010 | Kim et al. | |
| 2010/0181582 A1 | 7/2010 | Li et al. | |
| 2010/0270577 A1 | 10/2010 | Rulkens et al. | |
| 2011/0006658 A1 | 1/2011 | Chan | |
| 2011/0031865 A1 | 2/2011 | Hussell et al. | |
| 2011/0180827 A1 | 7/2011 | Hussell | |
| 2011/0186873 A1 | 8/2011 | Emerson | |
| 2011/0316022 A1 | 12/2011 | Hussell | |
| 2012/0069560 A1 | 3/2012 | Miskin et al. | |
| 2012/0127720 A1 | 5/2012 | Hussell et al. | |
| 2012/0153317 A1 | 6/2012 | Emerson et al. | |
| 2013/0003375 A1 | 1/2013 | Hussell | |
| 2013/0011946 A1 | 1/2013 | Hussell | |

FOREIGN PATENT DOCUMENTS

| | | |
|---|---|---|
| EP | 001242234 | 1/2011 |
| EP | 2 438 631 | 4/2012 |
| EP | 2 603 930 | 6/2013 |
| JP | D1102760 | 3/2001 |
| JP | 2005-179147 | 7/2005 |
| JP | 2005-209763 | 8/2005 |
| JP | 2007-108547 | 4/2007 |
| JP | 2008-091792 | 4/2008 |
| JP | 2008-103480 | 5/2008 |
| JP | 2008-545269 | 12/2008 |
| JP | D1346959 | 12/2008 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 1020070000130 | 1/2007 |
| KR | 10-0845856 | 7/2008 |
| KR | 1020090003378 | 1/2009 |
| KR | 30-0681227 | 2/2013 |
| TW | 100305347 | 3/2012 |
| TW | D146222 | 4/2012 |
| TW | D148144 | 7/2012 |
| WO | WO 2007/126720 | 11/2007 |
| WO | WO 2008/021268 | 2/2008 |
| WO | WO-2010/141215 | 12/2010 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Non-Final Office Action for U.S. Appl. No. 12/969,267 dated Mar. 29, 2013.

Notice of Allowance for U.S. Appl. No. 13/082,699 dated Apr. 3, 2013.

Korean Notice of Allowance for Application No. 30-2010-0047049 dated Apr. 4, 2013.

(56) References Cited

OTHER PUBLICATIONS

Non-Final Office Action for U.S. Appl. No. 13/011,609 dated Jun. 7, 2013.
Description Model No. NS6x083x issued by Nichia Corporation—at least as early as Feb. 17, 2007.
Description Model No. NS6G083 issued by Nichia Corporation—at least as early as Aug. 31, 2007.
Hyun-Ho Kim et al., Thermal Transient Characteristics of Die Attach in High Power LED PKG, Microelectronics Reliability, vol. 48, Issue 3, Mar. 2008, pp. 445-454.
Notice of Allowance from U.S. Appl. No. 29/330,657 dated Sep. 25, 2009.
Notice of Allowance dated Apr. 16, 2010 from U.S. Appl. No. 29/338,186.
Chinese Notice of Patent Grant for CN 200930286397.5 dated May 19, 2010.
Non-Final Office Action for U.S. Appl. No. 12/479,318 dated Jun. 2, 2010.
Notice of Allowance for U.S. Appl. No. 29/353,652 dated Aug. 24, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
U.S. Appl. No. 12/969,267, filed Dec. 15, 2010.
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Japanese Office Action for JP2010-026185 dated Apr. 5, 2011.
Notice of Allowance for Design U.S. Appl. No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Taiwanese Office Action for Appl. No. 099305566 dated Jul. 12, 2011.
Notice of Allowance for Design U.S. Appl. No. 29/360,791 dated Jul. 21, 2011.
Notice of Allowance for Design U.S. Appl. No. 29/380,549 dated Jul. 28, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 8, 2012.
Communication of European publication number and information on the application of Article 67(3) EPC dated Mar. 14, 2012.
Taiwanese Notice of Allowance for Application No. 100305347 dated Mar. 23, 2012.
Non-Final Office Action for U.S. Appl. No. 13/082,699 dated Apr. 13, 2012.
Certificate of Design Patent for Chinese Application Serial No. CN ZL 201130171313 dated May 7, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Certificate of Design Patent for Application Serial No. CN ZL 201130210595 dated Jun. 11, 2012.
Certificate of Design Patent for Application Serial No. CN ZL 201030577293 dated May 23, 2012.
International Search Report for Application Serial No. PCT/US2012/023285 dated Jun. 27, 2012.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/024122 dated Jul. 11, 2012.
Restriction Requirement for U.S. Appl. No. 29/382,394 dated Jul. 17, 2012.
Supplemental Notice of Allowance for U.S. Appl. No. 29/397,017 dated Jul. 23, 2012.
Notification Concerning Availability of the Publication Serial No. PCT/US2012/023285 dated Aug. 9, 2012.
Notification Concerning Availability of the Publication Serial No. PCT/US2012/024122 dated Aug. 16, 2012.
Korean Office Action for Application Serial No. KR 30-2010-0047049 dated Sep. 12, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notice of Allowance for U.S. Appl. No. 13/082,699 dated Oct. 23, 2012.

(56) References Cited

OTHER PUBLICATIONS

Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Non-Final Office Action for U.S. Appl. No. 13/462,450 dated Jan. 15, 2013.
Non-Final Office Action for U.S. Appl. No. 12/825,075 dated Feb. 1, 2013.

* cited by examiner

LIGHT EMITTING DIODE (LED) PACKAGES, SYSTEMS, DEVICES AND RELATED METHODS

CROSS REFERENCE TO RELATED APPLICATIONS

This application relates and claims priority to U.S. provisional patent application 61/482,088, filed May 3, 2011. This application further relates, claims priority to and is a continuation-in-part application from these related matters: co-pending U.S. utility patent application Ser. No. 12/969,267, filed Dec. 15, 2010; U.S. design patent application Ser. No. 29/382,394, filed Jan. 3, 2011 now U.S. Pat. No. D679,872; and co-pending U.S. utility patent application Ser. No. 13/362,683, filed Jan. 31, 2012; and co-pending U.S. utility patent application Ser. No. 13/367,929, filed Feb. 7, 2012. The entire contents of all of the above matters are hereby incorporated by reference herein.

TECHNICAL FIELD

The subject matter disclosed herein relates generally to light emitting diodes (LED) packages and, more particularly, to LED packages having a reflector cavity with angled wall portions for housing LED devices and reflecting light therefrom.

BACKGROUND

Solid state light sources, such as light emitting diodes (LEDs), are widely used in lighting products for commercial and personal use, including, for example, indoor and outdoor lighting applications and backlighting displays for monitors and televisions. Incandescent and fluorescent bulbs and tubes have long been the standard in the lighting industry. Incandescent and fluorescent bulbs and tubes can be inefficient in the use of energy, can have short lifespans, and/or can cause disposal problems. For example, compact fluorescent lamps (CFL), while having longer life spans than incandescent lamps, have a relatively short lifespan. Due to the chemicals, for example, Mercury, used inside such lamps, these lamps cannot be disposed of after use in the normal course of garbage disposal. Disposal of such CFL lamps for large facilities is expense and can be time consuming due to the procedures that should be followed.

LEDs can be used in the design of compact, thin, energy-saving products having longer lifetimes than conventional lighting products on the market. Products using LEDs require less power to meet the brightness specifications for a given lighting application, thereby significantly reducing energy consumption and the need for active cooling systems. A current trend in packaging LEDs is the use of thinner molded packages for fitting into thin, possibly flat, panel display systems. Thinner packages can, for example, have increased cavity angles to assist in exceeding or maintaining brightness specifications. As cavity angles increase, package material can incompletely mold about package components. For example, package material can incompletely mold about portions of a leadframe. This can lead to gaps, voids, incomplete resin filling, and low adhesion between components within a given package.

In recent years, there have been dramatic improvements in light emitting diode (LED) technology such that LEDs of increased brightness and color fidelity have been introduced. LED efficiencies are set to exceed those of fluorescent tubes, with dimming and controllable color rendering readily achievable. Multichip LED lamps can be mounted and used in fluorescent fittings, with ballast replaced by driver electronics. Spatial distribution, intensity and spectrum of light output from LED lamps in fluorescent fittings can be comparable to those produced by a fluorescent tube with the same or less power input. LED lamps in such fluorescent fittings, however, can be relatively expensive to manufacture. Smaller LEDs are desirable in such applications. Also, the LEDs can also create heat levels that, if they became excessive and/or the heat is not properly dissipated, can lead to LED and/or circuitry failure.

Additionally, due to these improved LEDs and improved image processing technology, large format, full color LED video screens have become available and are now in common use. Large format LED displays typically comprise a combination of individual LED panels providing image resolutions determined by the distance between adjacent pixels or "pixel pitch."

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, typically comprise panels carrying red, green, and blue LEDs mounted on a single electronic package such as a surface mount device (SMD) package. Each SMD usually defines a pixel. The relatively small SMDs are attached to a driver printed circuit board (PCB) that controls the output of each SMD.

Although both indoor and outdoor displays are viewable across a substantial range of off-axis angles, there is often a perceptible loss of color fidelity with increasing viewing angle. Additionally, the material of each LED package and/or the material used to mount each of the LEDs may have reflective characteristics, which can further decrease color fidelity by creating unwanted light reflection and/or glare.

It is well-known that SMDs and many other types of electronic packages, whether containing integrated circuits or discrete components such as diodes or power transistors, dissipate sufficient heat to require thermal management. Also, excessive heat may cause LEDs failures. Thus, one of the considerations for designing an LED system is effective thermal management. One of the objectives of effective thermal management in the design of electronic packaging is to maintain the operating temperature of the LEDs and other active circuit components at an appropriately low level to prevent premature component failure. Various cooling strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity LEDs that emit light principally in the visible part of the electromagnetic spectrum can generate a significant amount of heat that is difficult to dissipate using such conventional techniques.

The designing objectives of increasing the view angle, maintaining a relatively low operating temperature, and decreasing the size of an LED package are to some extent competitive with each other. There is a need therefore to develop an LED package that addresses all these designing objectives with lower cost.

SUMMARY

In accordance with this disclosure, LED packages, systems, devices and methods are provided. It is, therefore, an object of the present disclosure herein to provide novel LED packages, systems and methods as described for example in further detail hereinbelow.

These and other objects as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
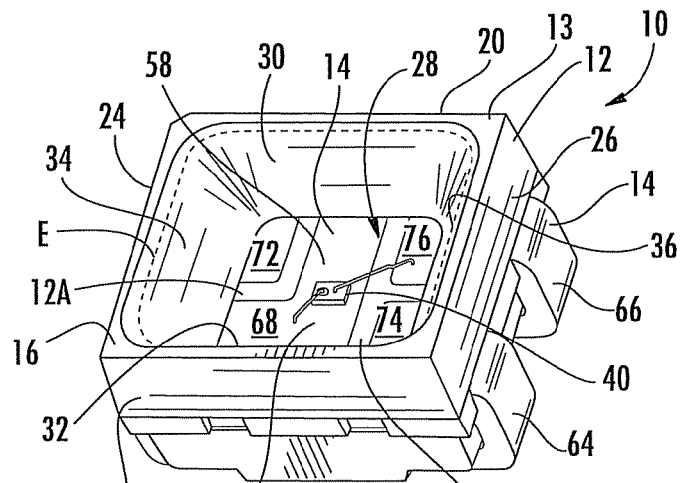
FIG. 1 is a top perspective view illustrating an embodiment of a light emitting diode (LED) package according to the subject matter disclosed herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion may be described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, an element may be referred to as being "directly connected", "directly attached", or "directly coupled" to another element when no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. Nos. 5,210,051, 5,393,993, and 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

Solid state light LEDs may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials may be disposed in such encapsulants.

The LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

FIGS. 1-8C depict a light-emitting diode (LED) package, generally designated 10 that can be, for example, a surface-mount device (SMD) and parts thereof according to specific, exemplary embodiments for use in LED displays such as indoor and/or outdoor LED screens. LED package 10 can comprise a casing 12 that forms a body 13 for carrying a lead frame 14, an embodiment of which is described in more detail below and to which one or more LEDs 40 can be electrically connected. For example, one or more LEDs 40 can be electrically connected by electrical connections such as, wire leads 40A, 40B (see, for example, FIG. 2) to lead frame 14. Other suitable electrical connections can also be used to electrically connect one or more LEDs 40 to lead frame 14 as are known within the art.

Casing 12 can be at least generally rectangular, including opposed, first and second main (or upper and lower) surfaces 16 and 18, respectively, opposing respective side surfaces 20 and 22, and end surfaces 24 and 26. Casing 12 and lead frame 14 can help define the outer dimension of LED package 10. In one embodiment, distance T (as seen in FIG. 3B) between upper surface 16 of casing 12, or body 12, and lower surfaces 90, 92 of lead frame 14, or the package profile height or thickness can be less than about, or approximately, 2.0 mm. For example, distance T between upper surface 16 and a lower surface 92 of lead frame 14 can be approximately 1.70 mm to approximately 1.95 mm. For instance, distance T between upper and lower main surfaces 16 and 18 can be approximately 1.90 mm. Distance W between side surfaces 20 and 22 can be less than approximately 3.0 mm. For example, distance W between side surfaces 20 and 22 can be approximately 2.7 mm to approximately 3.0 mm. For instance, distance W between side surfaces 20 and 22 can be approximately 2.8 mm. Distance L between end surfaces 24 and 26 can be less than approximately 3.5 mm. For example, distance L between end surfaces 24 and 26 also can range between approximately 3.1 mm to approximately 3.5 mm. For instance, distance L between end surfaces 24 and 26 can be approximately 3.2 mm.

Casing 12 can be fabricated from materials that are both electrically insulating and thermally conductive. In some embodiments, the casing can be a thermoplastic polycondensate. For example, in one aspect a thermoplastic polycondensate that can be used is polyphthalamide (PPA). In some embodiments, casing 12 can be formed of black PPA or white PPA. It has been found that the use of black material in image generation LED packages, such as with LED packages employed in video displays, improves contrast. Other casing materials that can be used can comprise ceramics, resins, epoxies, and glass.

In some embodiments, casing 12 can comprise a white plastic material, more specifically, a molded white plastic material. In one aspect, casing 12 can comprise any suitable moldable material. In another aspect, casing 12 can comprise a plastic material having quantitative and qualitative properties optimized for solid state device package applications. The plastic material can in one aspect comprise, for example, any suitable organic polymer, such as for example a heat resistant resin such as a polyamide resin. The plastic material can be filled with glass or mineral material for strength and something like titanium dioxide for reflectivity.

Utilizing a plastic material such as described herein for casing 12 can allow for an advantageous softness for casing 12 at operating temperatures as hardness can depend upon temperature. This softness can allow casing 12 to have improved reliability and useful lifetime. The plastic material can in one aspect be a liquid crystal polymer (LCP). An optimized plastic material in accordance herewith can comprise a glass transition temperature ($T_g$) that can, for example, be greater than approximately 110 degrees Celsius (° C.). The glass transition temperature ($T_g$) can, for example, be greater than approximately 115° C. or greater than approximately 120° C. In one aspect, the glass transition temperature ($T_g$) can be greater than approximately 123° C. The optimized plastic material in accordance herewith can also comprise a melting point temperature ($T_m$) that can be less than approximately 315° C. The melting point temperature ($T_m$) can, for example, be less than approximately 310° C. The melting point temperature ($T_m$) can, for example, be less than approximately 300° C. In one aspect, the melting point temperature ($T_m$) can be approximately 307° C. A plastic material with a $T_g$ of approximately 123° C. is higher than many plastics conventionally used and can allow the package to have increased stability at elevated temperatures. A plastic material with a lower $T_m$ of approximately 307° C. can allow better flowability because the melting temperature is lower than that of plastics conventionally used and the plastic body is easier to mold. The plastic selected for casing 12 can also comprise optimized qualitative properties. For example, a white plastic material can be chosen which exhibits a better reflectivity retention value while also exhibiting fewer tendencies to discolor, degrade, and/or yellow when subjected to heat and/or light exposure. The reflectivity of the plastic material can in one aspect be greater than 90% for example, and that level or another level of high reflectivity can be maintained over time, heat, moisture, and blue light exposure.

Other characteristics or features of the plastic material for casing 12 can comprise an elongation value (mechanical property) of approximately 1.4% or greater, or an elongation value of 1.6% or greater. In one aspect, the elongation value can be approximately 1.5% or greater. Also as a mechanical property, the flexural strength of the plastic material of casing 12 as measured by ASTM D790 standards can be approximately 150 MPa or lower, approximately 130 MPa or lower, or approximately 120 MPa or lower. In one aspect, the flexural strength of the plastic material of casing 12 can be approximately 140 MPa or lower as measured by ASTM D790 standards. Also as a mechanical property, the flexural modulus of the plastic material of casing 12 can be approximately 6.9 GPa or lower, or approximately 6.5 GPa or lower. In one aspect, the flexural modulus of the plastic material of casing 12 can be approximately 6.0 GPa or lower. As yet another mechanical property, the tensile strength of the plastic material of casing 12 can be approximately 100 MPa or lower as measured by ASTM D638 standards, approximately 90 MPa or lower, or approximately 80 MPa or lower. In one aspect, the tensile strength of the plastic material of casing 12 can be less than approximately 75 MPa as measured by ASTM D638 standards.

Casing 12 can further define a reflector recess or cavity 28 that can be disposed at least partially within casing 12. In one aspect, cavity 28 can extend from upper surface 16 into the body of casing 12. The effectiveness of the reflectivity of reflector cavity 28 can be enhanced by the tapering of reflector cavity 28 inwardly toward the interior of the casing. Thus, reflector cavity 28 can have angled wall portions 30, 32, 34, 36 that can form at least generally a rectangular shape. For example, angled side wall portions 30, 32 extend approximately parallel to each other, while angled end wall portions 34, 36 extend approximately parallel to each other with angled side wall portions 30, 32 being approximately perpendicular to angled end wall portions 34, 36. Angled side wall portions 30, 32 can be angled at a different angle from angled end wall portions 34, 36 as described further below. A transition wall portion 39A, 39B, 39C, 39D can reside between angled side wall portions 30, 32 and angled end wall portions 34, 36 that provide a transitioning of respective angles of the respective wall portions 30, 32, 34, 36. As illustrated in FIGS. 1-3B, angled side wall portions 30, 32 can be longer than angled end wall portions 34, 36. Thus, in accordance with an aspect of the disclosure, the size of the cavity is increased compared to, for example, circular shaped cavities. The ratio of the area of the cavity floor over the area of the main surface can be at least 35%. In some embodiments, it is greater than 40%. In still other embodiments, the ratio is greater than 50%.

Reflector cavity 28 can optionally be coated with a reflecting substance and/or filled to a desired level with an encapsulant E (as shown, for example, in dotted lines in FIG. 1). In FIG. 1, the dotted line illustrates a first level to which encapsulant E can be filled within reflector cavity 28. That is, encapsulant E can be filled to a level substantially flush with upper main surface 16, or in the alternative it may be filled to any suitable level within reflector cavity 28 and can comprise a concave or convex surface and even exceed or extend above upper main surface 16. Encapsulant E can protect and positionally stabilize lead frame 14 and the one or more LEDs 40 carried thereby. In some instances, encapsulant E may cover the one or more LEDs 40, the portions of lead frame 14 exposed through reflector cavity 28, and the LEDs' electrical connections. Encapsulant E can be selected to have predetermined optical properties so as to enhance the projection of light from the LEDs. Encapsulant E can comprise any suitable material known in the art. For example, encapsulant E can be formed from a resin, an epoxy, a thermoplastic polycondensate, glass, and/or other suitable materials or combinations of materials. In some embodiments, materials can be added to encapsulant E to enhance the emission, absorption and/or dispersion of light to and/or from the LEDs. For instance, encapsulant E can optionally comprise a phosphor or a lumiphor to interact with light emitted by one or more LEDs 40 and responsively emit light of a different wavelength spectrum. In some embodiments, a reflective insert or ring can be positioned and secured along at least a portion of angled wall portions 30, 32, 34, 36 of reflector cavity 28. Also, the reflective insert or ring can be integral with casing 12 and may be made from the same material as casing 12. As described further relating to possible dimensions and cavity wall angles for an LED package in accordance with the subject matter herein, the total volume within cavity 28 can be larger than other similar LED packages, such as for instance those where the cavity or recess is circular.

Figure 3A:
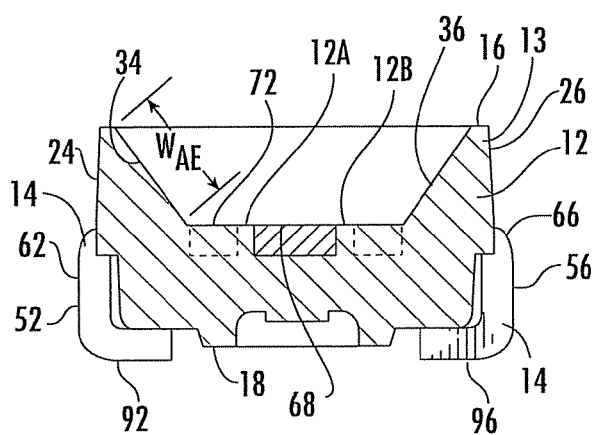
FIG. 3A is a cross-sectional view illustrating the embodiment of the LED package taken along line 3A-3A in FIG. 2.
Figure 3B:
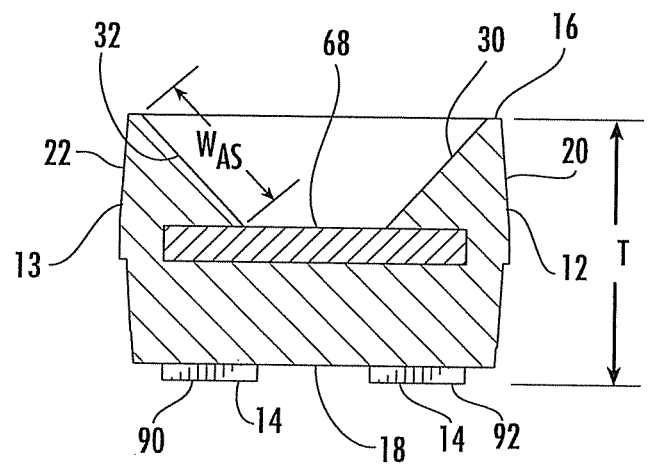
FIG. 3B is a cross-sectional view illustrating the embodiment of the LED package taken along line 3B-3B in FIG. 2.
Figure 4:
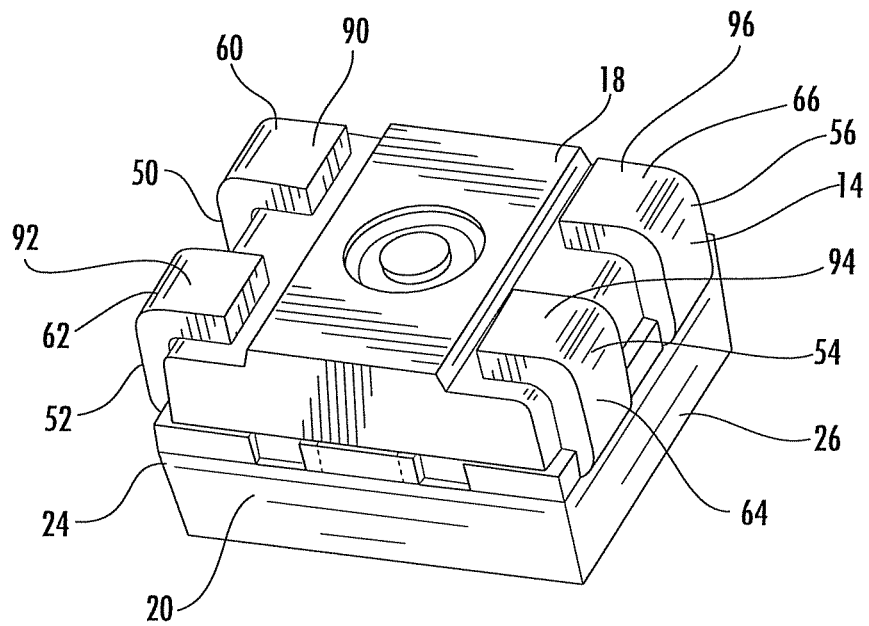
FIG. 4 is a bottom perspective view illustrating the embodiment of the LED package according to FIG. 1.

As shown in FIGS. 3A and 3B, angled side wall portions 30, 32 can have a length $W_{AS}$ and angled end wall portions 34, 36 can have a length $W_{AE}$. Length $W_{AE}$ of angled end wall portions 34, 36 can be greater than length $W_{AE}$ of angled side wall portions 30, 32. By having length $W_{AE}$ of angled end wall portions 34, 36 greater than length $W_{AE}$ of angled side wall portions 30, 32, the angle of angled side wall portions 30, 32 (and between angled side wall portions 30, 32) can be greater than the angle of angled end wall portions 34, 36 (and between angled end wall portions 34, 36) as described further below.

Figure 6:
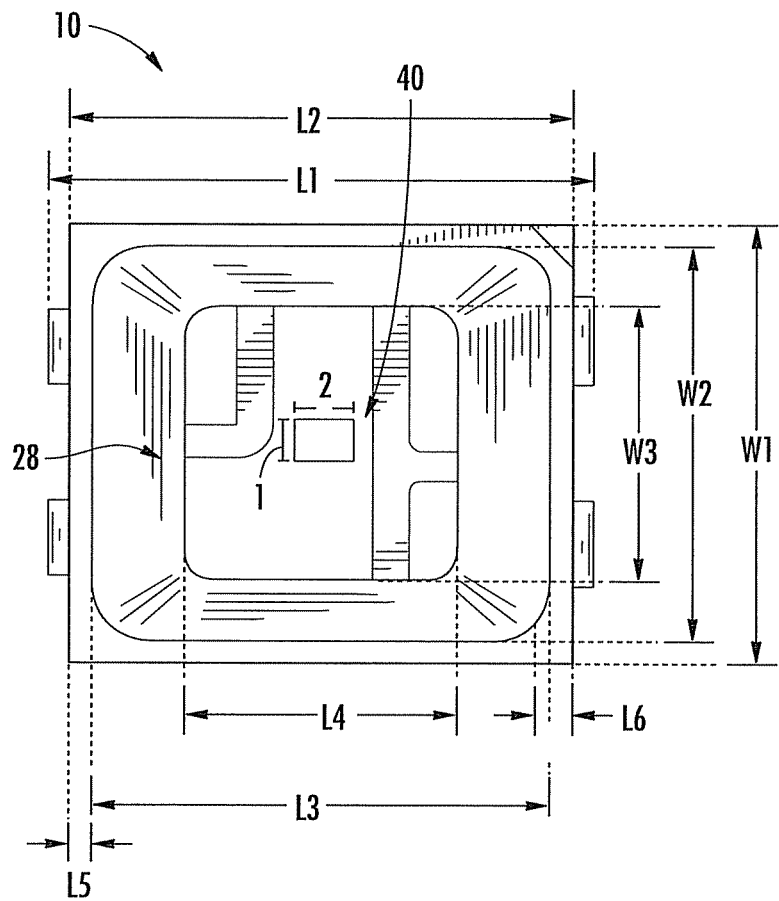
FIG. 6 is a top plan view illustrating another embodiment of an LED package according to the subject matter disclosed herein.

FIG. 6 illustrates a top view of LED package 10. LED package 10 is shown with one LED 40 schematically illustrated therein, but there can be one or more LEDs 40. LED package 10 is generic and included herein to illustrate possible further dimensions. LED 40 can comprise a width 1 and a length 2 which can be any suitable dimensions. LED package 10 illustrates various dimensions of the package itself. For example, typical dimensions, for instance, lengths, widths, thicknesses, and areas can be such as those illustrated in FIG. 6 and disclosed in Table 1 below.

TABLE 1

| Reference Character | Description of Dimension | Approximate Measurement (in mm) |
| --- | --- | --- |
| L1 | Overall package length, including portions of electrical leads | 3.5 |
| L2 | Length of package body | 3.2 |
| L3 | Length of reflector cavity measured at upper surface of body | 2.9 |
| L4 | Length of cavity floor | 1.74 |
| L5 | Length of upper surface of body disposed outside of reflector cavity | 0.15 |
| L6 | Corner length | 0.3 |
| W1 | Width of overall package body | 2.7 to 3 |
| W2 | Width of reflector cavity measured at upper surface of body | 2.4 to 2.5 |
| W3 | Width of cavity floor | 1.74 |
| *T | Overall thickness of package | 1.9 |

*designates the thickness dimension as illustrated in FIG. 3B

Table 1 illustrates, without limitation, possible length and width dimensions for LED package 10. In one aspect, the overall package area (L1×W1) can be approximately 9.4 mm$^2$ to approximately 10 mm$^2$. Any shape, dimension, and structure of LED chip such as LED 40 can be used in LED package 10. As described earlier, more than one LED 40 can be disposed in LED package 10. LED 40 can have various lengths and widths. Any suitable dimension of LED 40 can be used. Distances L5 and L6 can be large enough to create a lip to hold encapsulant in cavity 28. Thus, distances L5 and L6 can be minimized to allow holding of encapsulant, while creating larger angled wall portions 30, 32, 34, 36. Thereby, reflective surfaces of reflector cavity 28 can be maximized and the wasted space on upper surface 24 can be minimized. Such an arrangement can result in at least about a 10% bright output of illumination.

Further, it is noted that, as shown in FIG. 1, the opening of reflector cavity 28 at upper surface 16 can be a larger rectangular shape and the opening of reflector cavity 28 at a cavity floor 70 (see FIGS. 7A and 7B) can be a smaller rectangular shape. The larger rectangular shape of the opening of reflector cavity 28 at upper surface 16 may be or may not be proportional to the smaller rectangular shape of the opening of reflector cavity 28 at cavity floor 70. For example, in some embodiments, the larger rectangular shape of the opening at upper surface 16 can be defined by longer side wall portions and shorter end wall portions, while the smaller rectangular shape at cavity floor 70 can be a square with the side wall portions and end wall portions that define that opening being substantially the same length.

Figure 2:
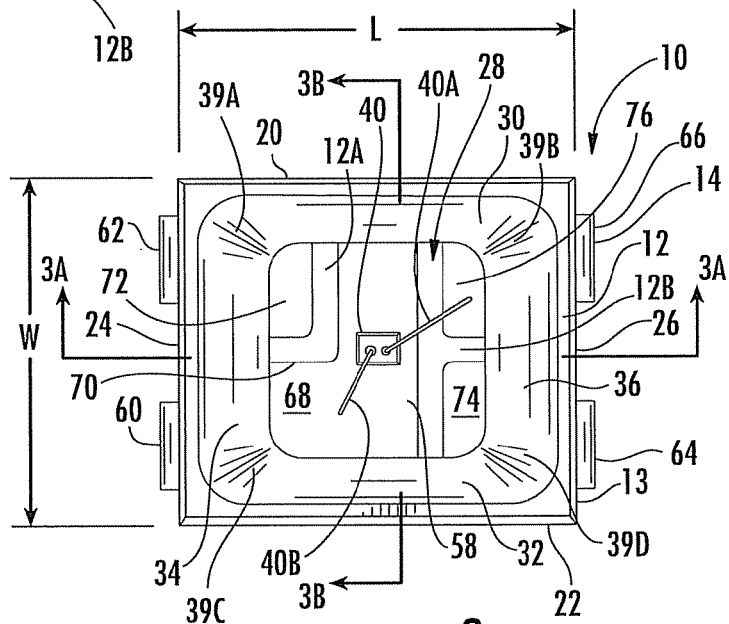
FIG. 2 is a top plan view illustrating the embodiment of the LED package according to FIG. 1.
Figure 5:
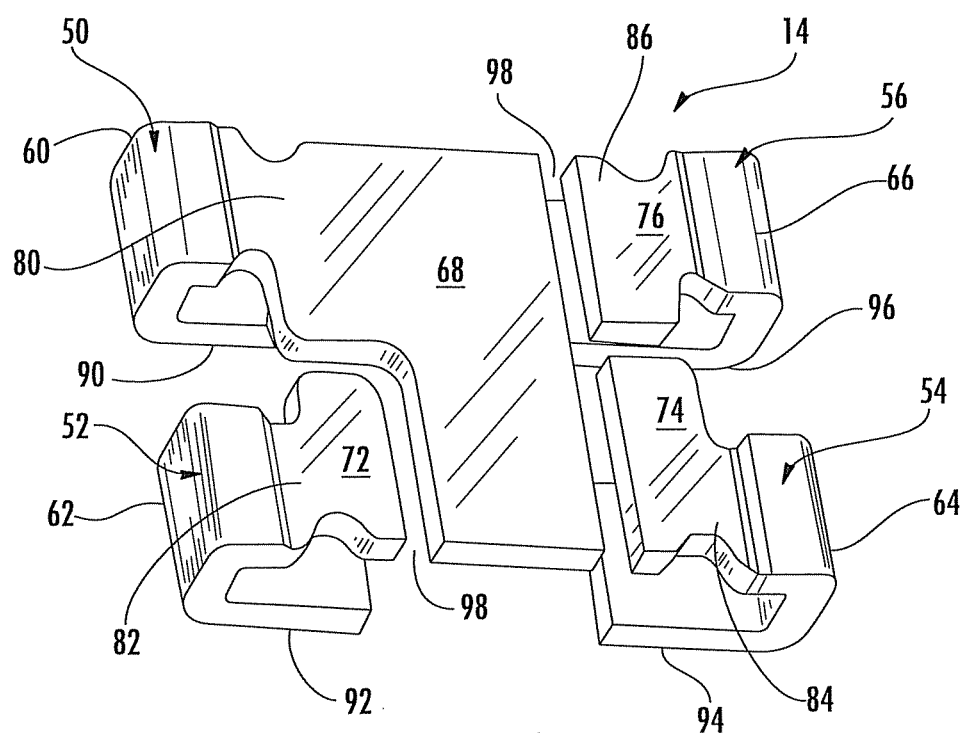
FIG. 5 is a perspective view illustrating a lead frame in accordance with one embodiment that may be used in an LED package according to the subject matter herein.

FIG. 5 illustrates one possible embodiment for a lead frame 14 with a slightly different orientation from the lead frame illustrated in FIGS. 1-4. Therefore, the same reference numeral is used. Lead frame 14 can comprise an electrically conductive chip carrier generally designated 50 and first, second, and third electrically conductive connection parts, respectively generally designated 52, 54, and 56, separate from the electrically conductive chip carrier. Electrically conductive chip carrier 50 and first, second, and third electrically conductive connection parts 52, 54, and 56 can form leads 60, 62, 64, and 66. Electrically conductive chip carrier 50 can have an upper surface 80 including a connection pad 68. Connection pad 68 can be exposed from casing 12. First electrically conductive connection part 52 can be at least partially surrounded by electrically conductive chip carrier 50. Each of the first, second and third electrically conductive connection parts can have an upper surface, a lower surface or terminal, and a connection pad on the upper surface. For example, in FIG. 5, first electrically conductive connection part 52 can have an upper surface 82, a lower surface 92, and a connection pad 72 on upper surface 82. Second electrically conductive connection part 54 can have an upper surface 84, a lower surface 94, and a connection pad 74 on upper surface 84. Third electrically conductive connection part 56 can have an upper surface 86, a lower surface 96, and a connection pad 76 on upper surface 86. Thus, first, second, and third electrically conductive connection parts 52, 54, and 56 can each have connection pads 72, 74, 76 respectively. As with connection pad 68, connection pads 72, 74, 76 can have at least a portion exposed from casing 12 as well as shown in FIGS. 1 and 2. A surface area of upper surface 82 of first electrically conductive connection part 52 can be less than an upper surface area of upper surface 84 or 86 of second and third electrically conductive connection parts 54 and 56.

Connection pad 68 can have opposing sides. One of the opposing sides, which can be close to connection pads 74 and 76, can be at least as long as end wall portions 34, 36 of reflector cavity 28 as shown in FIGS. 1 and 2. The other side, which is close to connection pad 72, is greater than approximately one half of the length of the adjacent end wall portion 34 of reflector cavity 28. One or more LEDs are disposed on upper surface 80 of electrically conductive chip carrier 50. For example, in FIGS. 1 and 2, LED 40 can be disposed on connection pad 68 of upper surface 80.

In some embodiments, solder pads are included on the bottom of the end portions such that no solder is visible when viewing each individual LED package from the top. This can be advantageous as it helps to prevent glare and improve contrast, particularly during daylight viewing. As best seen in FIGS. 1 and 2, reflector cavity 28 can extend into the casing interior a sufficient depth to expose the connection pads 60 and 72, 74, 76.

The particular dimensions of lower surfaces 90, 92, 94, and 96 of leads 60, 62, 64, and 66 that extend inwardly from end surfaces 32 and 34 of the casing can depend on the intended implementation of the surface mount LED package, the LEDs to be utilized, the material of casing 12, the size of the LED package and/or other such factors and/or combinations of factors. In some embodiments, electrically conductive chip carrier 50 and first, second, and third electrically conductive connection parts 52, 54, and 56 that form leads 60, 62, 64, and 66, respectively, may be separated by gaps 98 among connection pads 68 and connection pads 72, 74, 76, to electrically isolate connection parts 52, 54, and 56 from each other and from electrically conductive chip carrier 50. As shown in FIGS. 1-3A, in LED package 10, gaps 98 between connection pads 68 and connection pads 72, 74, 76 can be filled with casing material to form body portions 12A, 12B that isolate connection pads 68 and connection pads 72, 74, 76 from each other.

Referring to FIG. 5, enhanced heat dissipation can be realized by a surface area of upper surface 82 of first electrically conductive connection part 52 that is minimized to only have enough space to hold a connection pad 72. The surface area of upper surface 82 can be less than a surface area of either upper surface 84 or 86 of second and third electrically conductive connection parts 54 and 56. Electrically conductive connection parts 52, 54, and 56 can comprise enlarged electrical connection pads 72, 74, 76, respectively, positioned around a central region 58 (see FIGS. 1 and 2) adjacent to, but spaced apart from, the component carrying upper surface 80 of chip carrier 50. For example, as described above, gaps 98 can separate connection parts 52, 54, and 56 from each other and from electrically conductive chip carrier 50. In some embodiments of surface mount LED package 10, leads 60, 62, 64, and 66 can be bent to extend outside of and along their respective end surfaces 24 and 26 of the casing, then bent again so that lower surfaces 90, 92, 94, and 96 of leads 60, 62, 64, and 66 extend along lower surface 26 of casing 12. Lower surfaces 90, 92, 94, and 96 may also be referred to as pin pads. The outwardly facing surfaces of lower surfaces 90, 92, 94, and 96 of leads 60, 62, 64, and 66 and the bottom surface of a thermal conductive body can be substantially flush to facilitate connection to an underlying substrate. Lower surfaces 90, 92, 94, and 96 of the leads are electrically connected or bonded to traces or pads on the substrate using any of a number of well-known connection techniques, including soldering.

Electrically conductive chip carrier 50 and electrically conductive connection parts 52, 54, 56 can be made from an electrically conductive metal or metal alloy, such as copper, a copper alloy, other suitable low resistivity, corrosion resistant materials, or combinations of these materials. Because all the LED chips are disposed on electrically conductive chip carrier 50, a large surface area of upper surface 80 may help heat dissipation.

Referring to FIGS. 1, 2, 3A and 3B, reflector cavity 28 can be bounded from below by a floor 70 (including portions of connection pads 68, 72, 74, 76, and casing or body portions 12A, 12B), and bounded along edges by angled side wall portions 30, 32, angled end wall portions 34, 36, and transition wall portions 39A-39D. A transition wall portion 39A-39D is disposed between each respective angled side wall portions 30, 32 and angled end wall portions 34, 36. Each side wall portion 30, 32 and each end wall portion 34, 36 can comprise a substantially straight upper edge, and each transition wall portion 39A-39D can comprise a curved or segmented upper edge transitioning from the upper edge of a side wall portion 30, 32 to the upper edge of end wall portion 34, 36.

Figure 7A:
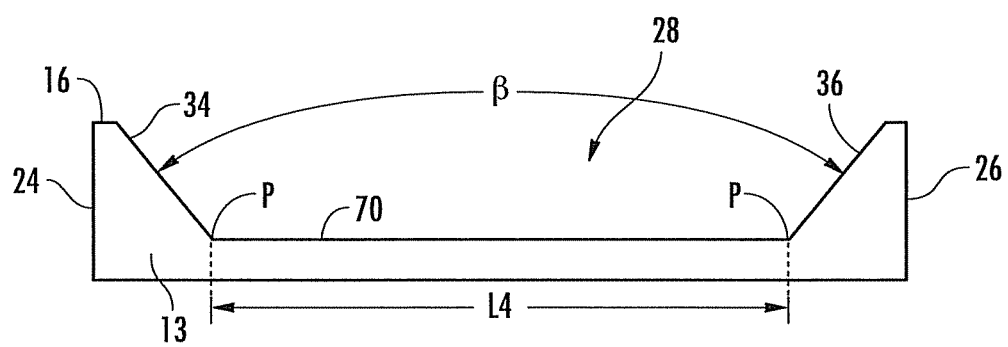
FIGS. 7A and 7B are cross-sectional side views illustrating a portion of an embodiment of a LED package according to the subject matter herein.
Figure 7B:
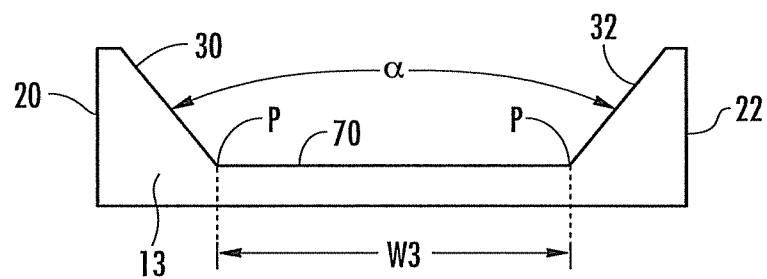

FIGS. 7A and 7B illustrate schematic drawings of cavity angles that LED packages, such as LED package 10 and other packages described herein, can have. Points P in FIGS. 7A and 7B can comprise an intersection area of where one or more cavity, or angled, wall portions 30, 32, 34, and/or 36 extends towards and intersects cavity floor 70. In one aspect, one or more cavities can comprise a cavity angle measured between walls of reflector cavity 28. In one aspect, cavity angles of packages described herein can comprise 90° or more. In another aspect, cavity angles of packages described herein can comprise 90° or less.

For example, FIG. 7A illustrates a portion of cavity floor 70 disposed between exterior lateral end walls 24 and 26. That is, FIG. 7A illustrates the longer measurement L4 of cavity floor. In one aspect for example, the cavity angle β between the cavity end wall portions 34 and 36 of the reflector cavity 28 can be approximately 72°. In one aspect, cavity angle β between the cavity end wall portions 34, 36 of the reflector cavity 28 (as measured between the end wall portions) can be at least approximately 70° or more depending on the thickness T (see FIG. 3B) of the LED package. Thinner, optimized packages with thinner dimensions can comprise larger cavity angles which can allow the reflection level within the package to maintain or exceed the amount of reflected light. Such reflected light can maintain or exceed, for example, current brightness standards for similar packages. As cavity angles increase, the area beneath the point formed by the cavity wall and cavity floor can become so small that viscous material cannot mold therein, forming voids. The packages described herein can reduce and/or eliminate the voids by providing larger areas below the point where the cavity wall meets the cavity floor, and/or displacing electrical leads at least a distance away from the point, or edge of the cavity floor.

FIG. 7B illustrates a portion of cavity floor 70 disposed between exterior lateral side walls 20 and 22. That is, FIG. 7B illustrates the shorter width measurement W3 of cavity floor 70. In one aspect, the cavity angle α between cavity, or angled, side wall portions 30, 32 of reflector cavity 28 (as measured between the side wall portions) can be approximately 50° or more, for example, approximately 51°. In one aspect, the cavity angle α between cavity side wall portions 30, 32 of reflector cavity 28 can be at least approximately 45° or more depending on thickness T (see FIG. 3B) of the LED package. Again, thinner, optimized packages with thinner dimensions can comprise larger cavity angles which can allow the reflection level within the package to maintain or exceed the amount of reflected light, such that the reflected light can maintain or exceed current brightness standards.

Figure 8A:
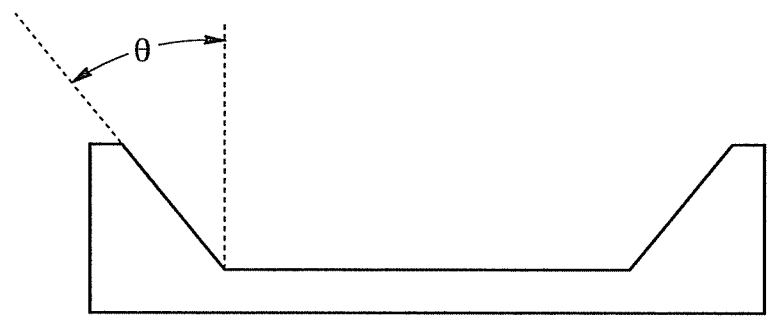
FIGS. 8A-8C are cross-sectional schematic side views illustrating portions of embodiments of LED packages according to the subject matter herein.
Figure 8B:
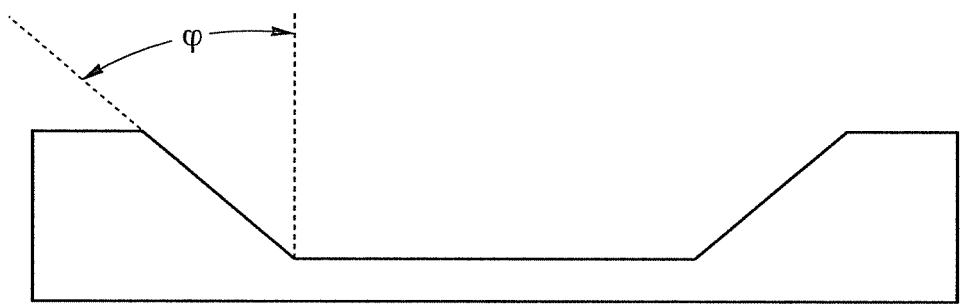
Figure 8C:
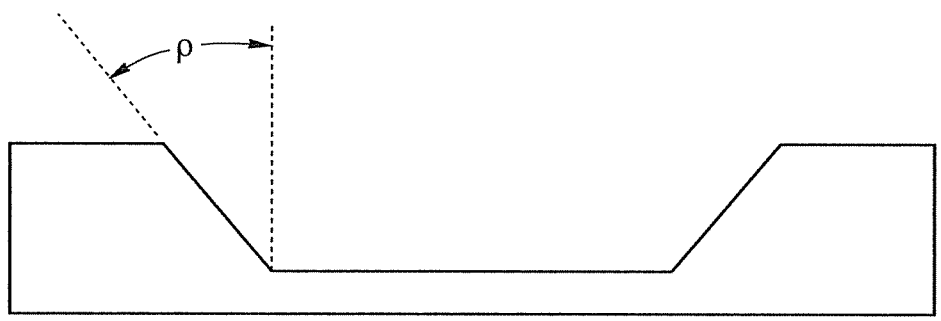

Each transition wall portion 39A-39D can be inclined at a larger average angle, relative to a plane perpendicular to the floor of the reflector cavity, than each side wall portion 30, 32 and each end wall portion 34, 36. For example, FIG. 8A provides a simplified schematic cross-sectional view of a body portion, illustrating an angle θ of a side wall portion thereof relative to a plane perpendicular to the floor of the body cavity, while FIG. 8B provides a simplified schematic cross-sectional view of a body portion, illustrating an angle φ of an end wall portion thereof relative to a plane perpendicular to the floor of the body cavity. Similarly, FIG. 8C provides a simplified schematic cross-sectional view of a body portion, illustrating an angle ρ of a transition wall portion relative to a plane perpendicular to the floor of the body cavity.

In some embodiments, each side wall portion can be inclined at an angle θ of at least approximately 25° or greater. In further embodiments, angle θ may be at least approximately 30°, or at least approximately 35°. In some embodiments, each side wall portion can be inclined at an angle φ of at least approximately 30°. In further embodiments, angle φ can be at least approximately 35°, or at least approximately 40°. In some embodiments, each transition wall portion is inclined at an angle ρ of at least approximately 35°. In further embodiments, angle ρ can be at least approximately 40°, or at least approximately 45°. Such angles of side wall portions 30, 32, end wall portions 34, 36, and transition wall portions 39A-39D are greater than typically employed in solid state emitter devices. Although the side wall/end wall portions and transition wall portions are illustrated in FIGS. 8A-8B as being angular from the floor of the cavity to the upper edge of the package, in an alternative embodiment any one or more (or all) of these wall portions can be characterized by a segmented and/or curved cross-section, that is, with the wall extending from the floor to the upper edge of the package being non-linear along at least a portion thereof. If such walls are curved or segmented, then the inclination angles mentioned above can correspond to an average angle of a curved or segmented wall, or an angle between endpoints of such a wall. Use of side wall portions 30, 32/end wall portions 34, 36 and transition wall portions 39A-39D of alternating angles enables frontal area of reflector cavity 28 to be maximized relative to shaped upper surface 16, while providing desirably diffused output beam characteristics, particularly when multiple emitters, such as multiple LEDs, are disposed in cavity 28.

Figure 9:
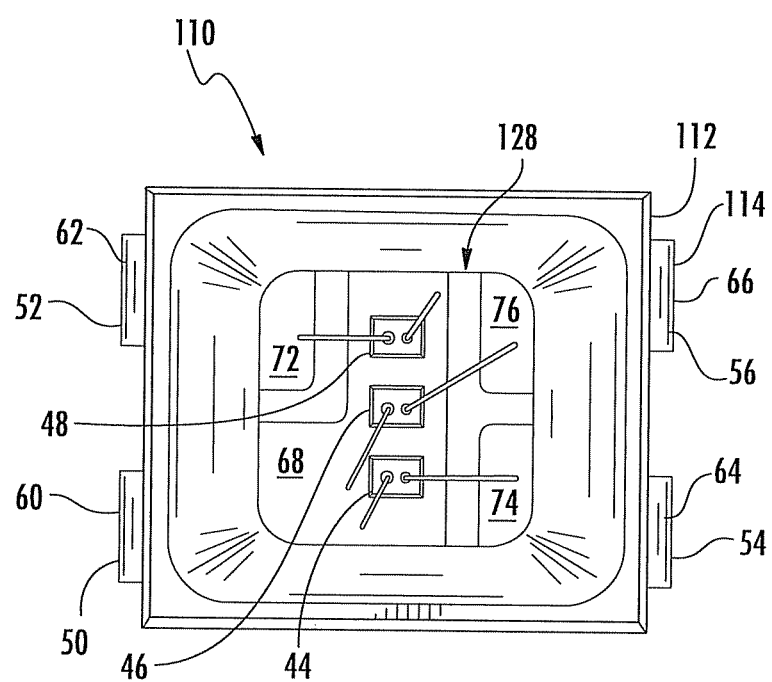
FIG. 9 is a top plan view illustrating a further embodiment of an LED package according to the subject matter herein.

In the illustrative embodiment of FIG. 9, an LED package 110 is provided can comprises a casing 112 carrying a lead frame 114 that can be as described above. Thus, the same reference numerals indicate the same or similar elements. LED package 110 can further comprise one or more LEDs. In the embodiment shown in FIG. 9, for example, LED package 110 comprises three LEDs 44, 46, 48 that can emit red, green and blue colors, respectively, so that when appropriately energized the LEDs produce in combination a substantially full range of colors. The LED chips can have a square-like size or rectangular size. For example, the square-like LED chip can have a profile height less than bout 0.11 mm, or in the range of approximately 0.09 mm to approximately 0.11 mm, or less than approximately 0.1 mm, or in the range of approximately 0.08 to approximately 0.10 mm. The square-like LED chip can have a profile width of less than approximately 0.32 mm, or in the range of 0.265 mm to 0.315 mm. The square-like LED chip can have a profile width of less than approximately 0.38 mm, or in the range of approximately 0.33 mm to approximately 0.38 mm. The rectangular LED chip can have a profile height of less than approximately 0.13 mm, or in the range of approximately 0.10 mm to approximately 0.13 mm. The rectangular LED chip can have a profile width of less than approximately 0.28 mm, or in the range of approximately 0.20 mm to approximately 0.28 mm. The rectangular LED chip can have a profile width of less than approximately 0.36 mm, or in the range of approximately 0.28 mm to approximately 0.36 mm.

As above, lead frame 114 can comprise electrically conductive chip carrier 50 and electrically conductive connection parts 52, 54, and 56 that provide connection pads 72, 74, and 76. Electrically conductive chip carrier 50 and electrically conductive connection parts 52, 54, and 56 form leads 60, 62, 64, and 66. Electrically conductive chip carrier 50 can have an upper surface 80 comprising a connection pad 68. Connection pad 68 can be exposed from casing 112. Connection pad 68 has opposing sides. One of the opposing sides, which is close to connection pads 74 and 76, can be at least as long as a side of cavity 128. The other side of connection pad 68, which is close to connection pad 72, can be greater than approximately ½ of the length of the adjacent side of cavity 128. A plurality of LEDs can be disposed on upper surface 80 of the electrically conductive chip carrier 50. For example, in FIG. 9, three LEDs 44, 46, and 48 are disposed on connection pad 68 of upper surface 80. The three LEDs usually emit lights in different color. For example, LED 44 can emit red light, LED 46 can emit green light, and LED 48 can emit blue light. Two or more of the LEDs may emit the same color, including white. For example, LED 44 and LED 46 can both emit red light. Each LED has a first electrical terminal and a second electrical terminal. The first electrical terminal can be called an anode. For example, first LED 44 can have an anode electrically coupled to connection pad 74 of electrically conductive connection part 54. Second LED 46 can have an anode electrically coupled to connection pad 76 of electrically conductive connection part 56. Similarly, Third LED 48 can have an anode electrically coupled to connection pad 72 of electrically conductive connection part 52. As above, chip carrier 50 also works as a heat sink to dissipate heat from the plurality of LEDs.

The dimensions of the blue and green LEDs can be a width of approximately 205 microns to approximately 275 microns and a length of approximately 285 microns to approximately 355 microns. In one embodiment, the blue and green LEDs can have a width of approximately 240 microns and a length of approximately 320 microns. The thickness of the blue and green LEDs can vary from approximately 100 microns to approximately 130 microns, for example, approximately 115 microns.

The red LEDs can have various sizes. In some embodiments, the red LEDs can have a width and length of approximately 355 microns, but the widths and lengths can range in size from approximately 330 microns to approximately 380 microns. The thicknesses of the red LEDs in such embodiments can be approximately 70 microns to approximately 125 microns, for example, approximately 100 microns. In such embodiments, the red LEDs have bonding pads ranging in size from approximately 90 microns to approximately 110 microns, for example, approximately 100 microns.

In some embodiments, the red LEDs can have a width and length of approximately 290 microns, but the widths and lengths can range from approximately 265 microns to approximately 315 microns. The thicknesses of the red LEDs in such embodiments can be approximately 100 microns, but the thicknesses can range from approximately 85 microns to approximately 115 microns. In such embodiments, the red LEDs can have bonding pads ranging in size from approximately 80 microns to approximately 100 microns, for example, approximately 90 microns.

Figure 10:
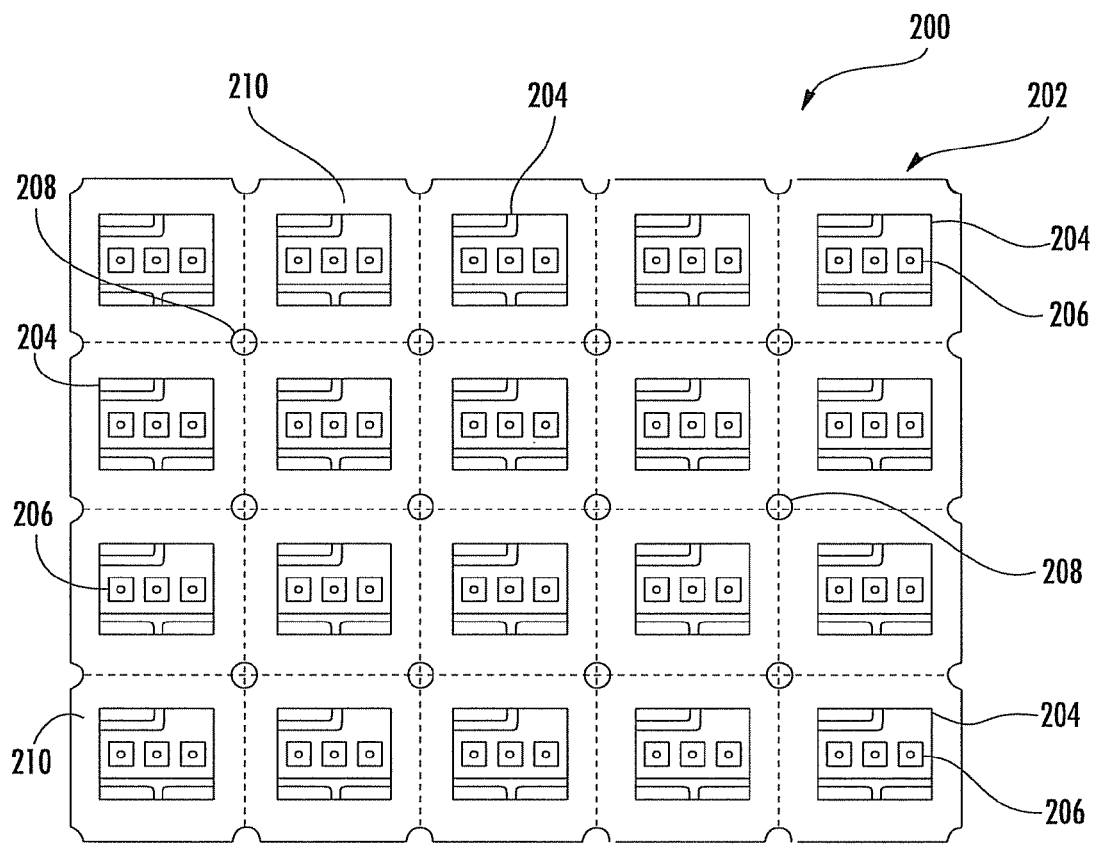
FIG. 10 is a top plan view illustrating an embodiment of a display screen using embodiments of LED packages according to the subject matter herein.

FIG. 10 schematically illustrates a portion of an LED display screen generally designated 200. LED display screen 200 can be, for example, an indoor or an outdoor screen comprising, in general terms, a driver printed circuit board (PCB) 202 carrying a large number of LED packages 204 arranged in rows and columns, each LED package is attached or is integral to the other LED packages 204 to form a single screen. LED packages 204 can be electrically connected to traces or pads on PCB 202. In some embodiments, PCB 202 can be connected to an appropriate electrical signal processing and driver circuitry.

LED packages 204 can comprise, for example, LED packages 10, 110 as described above. Each LED package 204 can comprise a lead frame with a casing disposed on at least a portion of the lead frame. The casing can have a reflector cavity therein that forms a rectangular shaped opening around one or more LEDs 206 on the lead frame with the reflector cavity having angled end and side wall portions surrounding the one or more LEDs. As with the LED packages 10, 110 described above, the angle of each end wall portion of the reflector cavity can be at a different angle from the angle of each side wall portion. As shown in FIG. 10, each LED package 204 can have multiple LEDs 206 therein. For example, each of the LED packages 204 can carry a vertically oriented, linear array of red, green and blue LEDs 206 as described above. Such a linear orientation of the LEDs can improve color fidelity over a wide range of viewing angles. Alternatively, a single LED can be provided in each LED package as with package 10 from FIGS. 1-5.

Each LED package 204 can define a pixel 210. Each pixel 210 of the display can have a size of approximately 3.0 mm or less by approximately 3.5 mm or less. LED packages 204 can comprise devices such as those described above and illustrated in FIGS. 1-9. As stated above, LED packages 204 can be electrically connected to traces or pads on PCB 202 that are interconnected to provide appropriate electrical signal processing circuitry and driver circuitry (not shown). Through-holes 208 can also be provided to allow for better and shorter contact for the plastic casing body to the PCB. Through-holes 208 also allow for improved thermal dissipation.

LEDs for use in backlighting or other panel display systems can comprise an arrangement or planar arrays of red, green, and blue LED devices configured to emit light that appears as a pixel of white light in operation. Sizes of red, green, and blue LEDs can be selected to meet a desired brightness and/or intensity balancing level. Any configuration of the red, green, and blue LEDs can be used. LED packages and/or LEDs utilizing metal-to-metal die attach methods as described herein can be used in backlighting systems and any suitable display panel system 200. For example and without limitation, LED packages and/or LEDs used in backlighting and display panel systems can offer light output of up to 122 lumens at 300 mA in cool white (CW), and up to 100 lumens at 300 mA in warm white (WW) color points. For example, LED packages and/or LEDs disclosed herein can be used in lighting fixtures comprising fixtures used in display panel systems offering a minimum CRI for CW color points of 65 CRI. LED packages and/or LEDs disclosed herein can be used in lighting fixtures comprising fixtures used in display panel systems offering a minimum CRI for CW color points of 75 CRI which corresponds to a range of 5,000 K to 8,300 K CCT. LED packages and/or LEDs disclosed herein for use in display panel systems can also offer, for example, a minimum CRI for CW color points of 80 CRI which corresponds to a range of 2,600K to 3,700K CCT. Such LED packages and/or LEDs can be used for both standard and high voltage configurations.

Figure 11:
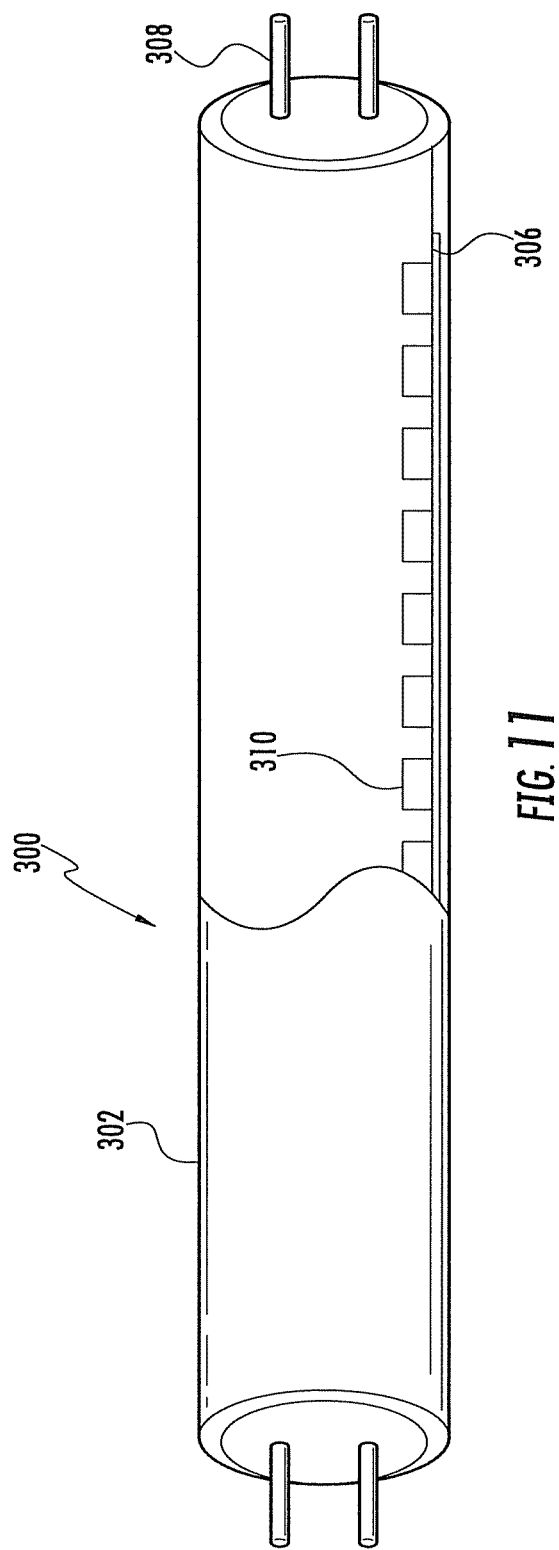
FIG. 11 is a partial cross-sectional side view illustrating an embodiment of a lighting device using embodiments of LED packages according to the subject matter herein.

Further, the LED packages described herein can be used in other general lighting areas such as in tube lighting or strip lighting devices. For example, as shown in FIG. 11, a lighting device 300 can comprise a tube 302 and LED packages 310 similar to LED packages 10, 110 described above with reference to FIGS. 1-4 that can be placed or attached in a single row. LED packages 310 can be integral with each other or can be separately attached to a substrate. LED packages 310 can be properly attached to a driver PCB 306 as shown FIG. 11. PCB 306 can be connected to appropriate electrical signal processing and driver circuitry such as an electrical connector 308. Tube 302 can be generally transparent or translucent. In some embodiments, a portion of tube 302, which LED packages 310 face, can be generally transparent or translucent, while a portion of tube 302 that PCB 304 faces can be opaque. The row or strip LED packages 310 can be inserted into a tube 302 that can be bigger, smaller or comparable to the dimensions of a fluorescent lighting tube, or CFL lamp, in a manner known in the art as the LED packages herein can replace fluorescent tube lights.

Figure 12:
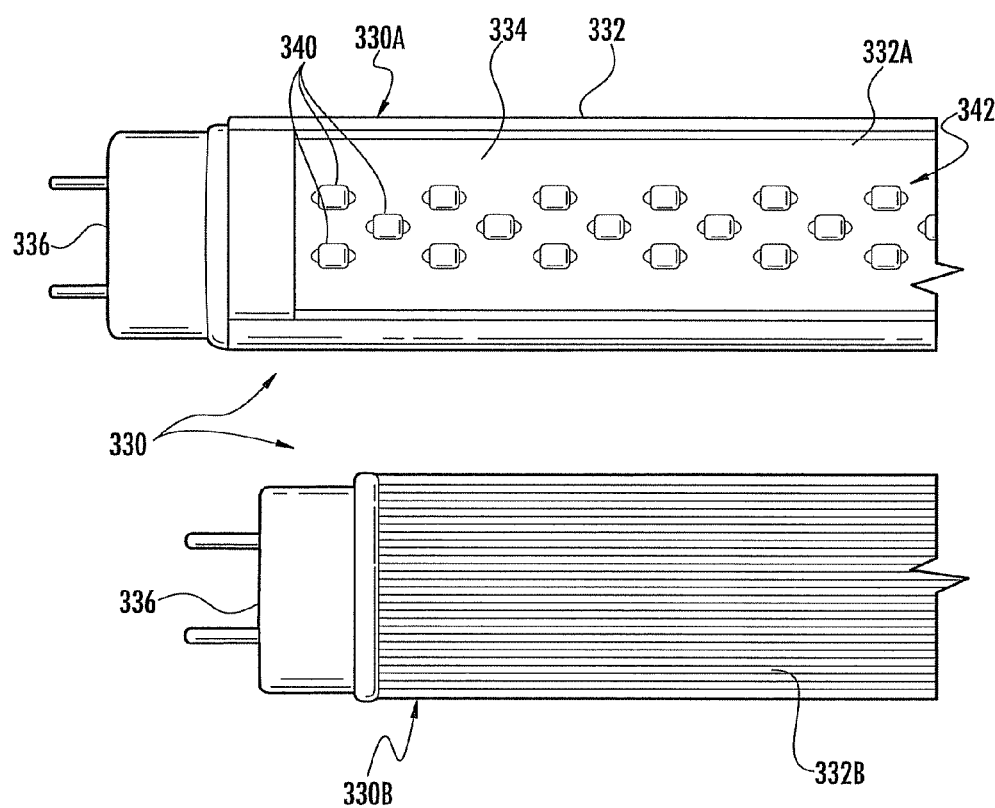
FIG. 12 is a top perspective view illustrating another embodiment of a lighting device using embodiments of LED packages according to the subject matter herein.

Arrays of LED packages can also be used in the lighting devices. Backlighting devices can be made in strips on the side (one row, no columns), or an array. An array of LED packages can be used in backlighting devices and other lighting devices, for example and without limitation, as shown in FIG. 12. In particular, FIG. 12 illustrates portions of a front side 330A and back side 330B of a lighting device 330. Such a lighting device 330 can be used in lighting fixtures that traditionally used CFL lamps, or fluorescent tubes. Thus, for example, lighting device 330 can be used in place of CFL lamps.

As in FIG. 12, lighting device 330 can comprise a tube 332 having a front side 332A and a back side 332B. Lighting device 330 can also comprise a PCB 334 disposed within tube 332 and an electrical connector 336 on either end of tube 332. Lighting device 330 can further comprise LED packages 340 similar to LED packages 10, 110 described above with reference to FIGS. 1-4 that can be electrically and operatively attached to a driver PCB 334 in an array 342. As shown in FIG. 12, array 342 can be in a checkerboard pattern. Such a checkerboard pattern array 342 can facilitate the creation of uniform lighting by lighting device 330.

As shown in FIG. 12, array 342 of LED packages 340 can be attached so that they face front side 332A of tube 332. Front side 332A can permit light generated by array 342 of LED packages 340 to shine therethrough. For example, front side 332A can be generally transparent or translucent. When lighting device 330 is placed in a lighting fixture, such as for example a lighting fixture that traditionally houses CFL lamps, back side 332A of tube 332 can face the lighting fixture while front side 332A of tube 332 faces outward so that light generated by array 342 of LED packages 340 shines outward into the area to be lighted. In embodiments such as these, back side 332B of tube 332 can be opaque. Tube 332 can be a single unitary tube so that front side 332A and back side 332B of tube 332 are a single integral piece. In such embodiments, back side 332B of tube 332 can be painted or coated with a generally opaque material. Alternatively, in some embodiments, front side 332A of tube 332 and back side 332A of tube 332 can comprise two different components that can be fitted together to form tube 332.

In some embodiments, back side 332A of tube 332 can be generally transparent or translucent. In such embodiments, a second PCB with LED packages, such as an array of LED packages, can be disposed in the tube so that the LED packages face back side 332A of tube 332 so that light generated by the LED packages shines therethrough. Such embodiments can be used in lighting fixtures where it is desirable to have light shining in opposite directions so that light from a single lighting device can shine in a more full range of area. For example, such lighting devices can create a light output that covers a large radius and portion of a circumference on either side of the lighting device. In this manner, a generally full radius of light can be generated.

Embodiments of the present disclosure shown in the drawings and described above are exemplary of numerous embodiments that can be made within the scope of the appended claims. It is contemplated that the configurations of LED packages, systems, and related methods can comprise numerous configurations other than those specifically disclosed herein.

What is claimed is:

1. A package for a light emitting diode (LED) comprising:
  a lead frame comprising an electrically conductive chip carrier comprising an upper surface for attachment of one or more LEDs;
  a casing covering at least a portion of the lead frame; and
  a reflector cavity disposed at least partially within the casing, the cavity having substantially parallel and angled side wall portions disposed between substantially parallel and angled end wall portions, the angled side wall portions and angled end wall portions surrounding at least a portion of the upper surface of the chip carrier, the side wall portions extending at an angle that is different from an angle at which the end wall portions extend.

2. The package of claim 1 wherein the lead frame is bent and comprises a profile thickness less than approximately 0.5 mm.

3. The package of claim 1 wherein the lead frame is bent and comprises a profile thickness between approximately 0.42 mm to approximately 0.48 mm.

4. The package of claim 1, wherein a height distance between a lower surface of the package and a upper surface of the package is less than approximately 2.0 mm.

5. The package of claim 4, wherein the height distance is from approximately 1.7 mm to approximately 2.0 mm.

6. The package of claim 5, wherein the height distance is approximately 1.9 mm.

7. The package of claim 1, wherein the casing forms outer side walls and outer end walls, with the outer side walls approximately perpendicular to the outer end walls.

8. The package of claim 7, wherein a width distance of the package as measured between outer side walls of the package is less than approximately 3.0 mm.

9. The package of claim 8, wherein the width distance is between approximately 2.7 mm to approximately 3.0 mm.

10. The package of claim 8, wherein the width distance is approximately 2.8 mm.

11. The package of claim 7, wherein a length distance of the LED package as measured between outer end walls of the LED package is less than approximately 3.5 mm.

12. The package of claim 11, wherein the length distance is between approximately 3.0 mm to approximately 3.5 mm.

13. The package of claim 12, wherein the length distance is approximately 3.2 mm.

14. The package of claim 1, wherein the angled side wall portions and angled end wall portions of the reflector cavity have transition wall portions disposed therebetween.

15. The package of claim 14, wherein the transition wall portions are disposed along at least one angle that is different from the angle of the side walls and the angle of the end walls.

16. The package of claim 15, wherein the angle of the transition wall portions is greater than the angle of the side walls and the angle of the end walls.

17. The package of claim 1, wherein the angled side wall portions of the reflector cavity are disposed along an angle of approximately 50° or more.

18. The package of claim 17, wherein the angled end wall portions of the reflector cavity are disposed along an angle of approximately 70° or more.

19. A light emitting diode (LED) package comprising:
a lead frame comprising an electrically conductive chip carrier comprising an upper surface;
at least one LED on the upper surface of the electrically conductive chip carrier;
a casing disposed on and covering at least a portion of the lead frame;
a reflector cavity in the casing, the cavity having angled side wall portions and angled end wall portions surrounding the LED, the angled side wall portions of the reflector cavity being disposed along an angle of approximately 50° or more, and the angled end wall portions of the reflector cavity being disposed along an angle of approximately 70° or more; and
the LED package having a width distance as measured between outer side walls of the LED package of less than approximately 3.0 mm, and the LED package having a length distance as measured between outer end walls of the LED package of less than approximately 3.5 mm.

20. A method of providing a light emitting device, the method comprising:
providing a lead frame comprising an electrically conductive chip carrier comprising an upper surface;
securing a casing covering at least a portion of the lead frame; and
forming a reflector cavity in the casing surrounding at least a portion of the upper surface, the reflector cavity having substantially parallel and angled side wall portions disposed between substantially parallel and angled end wall portions; wherein an angle at which the side wall portions are angled is different from an angle at which the end wall portions are angled.

21. The method of claim 20, further comprising disposing an LED on the upper surface of the electrically conductive chip carrier.

22. The method of claim 20, wherein the lead frame is bent and comprises a profile thickness less than approximately 0.5 mm.

23. The method of claim 20, wherein a height distance between a lower surface of the LED package and an upper surface of the LED package is less than approximately 2.0 mm.

24. The method of claim 20, wherein the casing forms outer side walls and outer end walls, with the outer side walls approximately perpendicular to the outer end walls.

25. The method of claim 24, wherein a width distance of the LED package as measured between outer side walls of the LED package is less than approximately 3.0 mm.

26. The method of claim 24, wherein a length distance of the LED package as measured between outer end walls of the LED package is less than approximately 3.5 mm.

27. The method of claim 20, wherein the angled side wall portions and angled end wall portions of the reflector cavity have transition wall portions disposed therebetween.

28. The method of claim 27, wherein the transition wall portions are disposed along an angle different from the angle of the side walls and the angle of the end walls.

29. The method of claim 28, wherein the angle of the transition wall portions are greater than the angle of the side walls and the angle of the end walls.

30. The method of claim 20, wherein the angled side wall portions of the reflector cavity are disposed along an angle different from an angle of the end wall portions of the reflector cavity.

31. The method of claim 30, wherein the angle of the end wall portions is approximately 70° or more.

32. The method of claim 30, wherein the angle of the side wall portions is approximately 50° or more.

33. An LED display comprising:
a printed circuit board (PCB); and
an array of LED packages arranged in vertical columns and horizontal rows and electrically connected to the PCB, each of LED packages comprising:
a lead frame comprising an electrically conductive chip carrier comprising an upper surface;
an LED on the upper surface of the electrically conductive chip carrier;
a casing disposed on the lead frame and covering at least a portion of the lead frame; and
a reflector cavity in the casing having angled side wall portions and angled end wall portions surrounding the LED, the side wall portions extending at an angle that is different from an angle at which the end wall portions extend.

34. An LED backlighting device comprising:
a printed circuit board (PCB); and
an array of LED packages arranged in vertical columns and horizontal rows and electrically connected to the PCB, each of LED packages comprising:
a lead frame comprising an electrically conductive chip carrier comprising an upper surface;
an LED on the upper surface of the electrically conductive chip carrier;
a casing disposed on the lead frame and covering at least a portion of the lead frame; and
a reflector cavity in the casing having angled side wall portions and angled end wall portions surrounding the LED, the side wall portions extending at an angle that is different from an angle at which the end wall portions extend.

35. The LED backlighting device of claim 34, wherein the vertical columns and horizontal rows are in a checkerboard pattern.

36. An LED lighting device comprising:
a printed circuit board (PCB); and
a strip of LED packages arranged in a row and electrically connected to the PCB, each of LED packages comprising:
a lead frame comprising an electrically conductive chip carrier comprising an upper surface;
an LED on the upper surface of the electrically conductive chip carrier;

a casing disposed on the lead frame and covering at least a portion of the lead frame; and a reflector cavity in the casing having angled side wall portions and angled end wall portions surrounding the LED, the side wall portions extending at an angle that is different from an angle at which the end wall portions extend.

37. The LED lighting device of claim 36 or any of the other claims above wherein the LEDs are arranged in a tube device.

* * * * *